(12) United States Patent
Ishii et al.

(10) Patent No.: US 9,293,719 B2
(45) Date of Patent: Mar. 22, 2016

(54) SEMICONDUCTOR DEVICE, METHOD OF MANUFACTURING THE SAME, AND ELECTRONIC APPARATUS

(71) Applicant: Sony Corporation, Tokyo (JP)

(72) Inventors: Yui Ishii, Kanagawa (JP); Hideki Ono, Tokyo (JP)

(73) Assignee: SONY CORPORATION, Tokyo (JP)

( * ) Notice: Subject to any disclaimer, the term of this patent is extended or adjusted under 35 U.S.C. 154(b) by 29 days.

(21) Appl. No.: 13/960,348

(22) Filed: Aug. 6, 2013

(65) Prior Publication Data

US 2014/0054568 A1 Feb. 27, 2014

(30) Foreign Application Priority Data

Aug. 21, 2012 (JP) .................. 2012-182465

(51) Int. Cl.
| | |
|---|---|
| *H01L 29/08* | (2006.01) |
| *H01L 51/00* | (2006.01) |
| *H01L 35/24* | (2006.01) |
| *H01L 51/10* | (2006.01) |
| *B82Y 10/00* | (2011.01) |

(52) U.S. Cl.
CPC ............... *H01L 51/105* (2013.01); *B82Y 10/00* (2013.01); *H01L 51/0037* (2013.01); *H01L 51/0045* (2013.01); *H01L 51/0048* (2013.01)

(58) Field of Classification Search
CPC .............. H01L 51/105; H01L 51/0045; H01L 51/0037; H01L 51/0048; B82Y 10/00
See application file for complete search history.

(56) References Cited

U.S. PATENT DOCUMENTS

| | | | | |
|---|---|---|---|---|
| 6,395,586 | B1 * | 5/2002 | Huang | H01L 29/458 257/59 |
| 8,022,405 | B2 * | 9/2011 | Yamazaki | H01L 27/12 257/57 |
| 8,872,171 | B2 * | 10/2014 | Yamazaki | H01L 29/4908 257/43 |
| 2005/0012097 | A1 * | 1/2005 | Yamazaki | H01L 27/12 257/59 |
| 2005/0263756 | A1 * | 12/2005 | Yatsunami | H01L 5/2201 257/40 |
| 2005/0279999 | A1 * | 12/2005 | Lee | H01L 51/105 257/66 |
| 2008/0099757 | A1 * | 5/2008 | Furukawa | C07D 209/88 257/40 |

FOREIGN PATENT DOCUMENTS

| | | |
|---|---|---|
| JP | 2006-156985 | 6/2006 |
| JP | 2011-049221 | 3/2011 |

* cited by examiner

*Primary Examiner* — Victor A Mandala

(74) *Attorney, Agent, or Firm* — Hazuki International, LLC

(57) ABSTRACT

A semiconductor device includes: a gate electrode; an organic semiconductor film forming a channel; and a pair of source-drain electrodes formed on the organic semiconductor film, the pair of source-drain electrodes each including a connection layer, a buffer layer, and a wiring layer that are laminated in order.

15 Claims, 15 Drawing Sheets

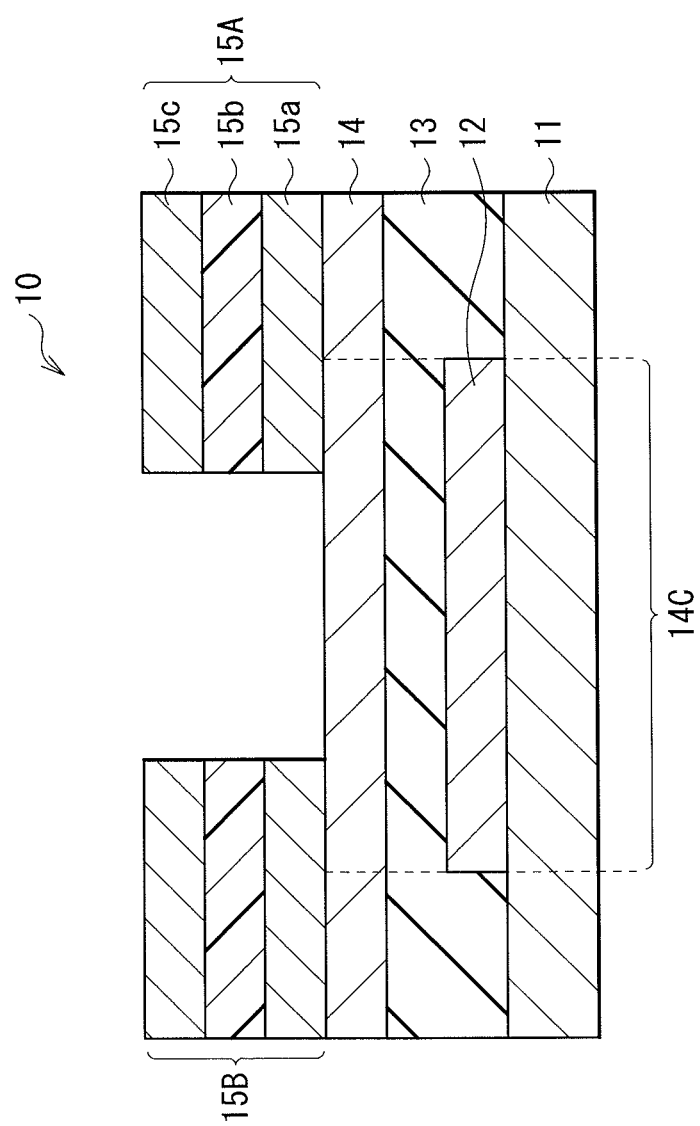

SEMICONDUCTOR DEVICE, METHOD OF MANUFACTURING THE SAME, AND ELECTRONIC APPARATUS

CROSS REFERENCES TO RELATED APPLICATIONS

The present application claims priority to Japanese Priority Patent Application JP 2012-182465 filed in the Japan Patent Office on Aug. 21, 2012, the entire content of which is hereby incorporated by reference.

BACKGROUND

The present application relates to a semiconductor device such as a thin film transistor (TFT), to a method of manufacturing the same, and to an electronic apparatus including the same.

In general, an organic semiconductor material is easily degraded under the influence of oxygen and moisture in the atmosphere. Therefore, in a thin film transistor (an organic transistor) using the organic semiconductor material, there is a disadvantage that characteristics such as carrier mobility are degraded by being exposed in the atmosphere.

To address the foregoing disadvantage, for example, in Japanese Unexamined Patent Application Publication No. 2006-156985 (JP2006-156985A), an organic transistor in which a protective film is provided between an organic semiconductor film and a sealing layer made of a resin is disclosed. Since, in the organic transistor, intrusion of oxygen and moisture into the organic semiconductor film is suppressed by the protective film, degradation of characteristics of the organic transistor due to oxygen and moisture is suppressed. However, in the case where the protective film is formed as in the organic transistor described in JP2006-156985A, there is a disadvantage that stress generated at the time of hardening a resin material used for the sealing layer damages the organic semiconductor film, leading to degradation of characteristics.

Therefore, for example, in Japanese Unexamined Patent Application Publication No. 2011-49221 (JP2011-49221A), an organic transistor in which a protective film suppressing intrusion of oxygen and moisture partly has a two-layer structure is disclosed. Specifically, the protective film is configured of a first protective film divided on an organic semiconductor film and a second protective film covering a portion of the organic semiconductor film exposed by dividing the first protective film and part of the first protective film. By such a configuration, stress generated at the time of hardening a resin material is relaxed.

SUMMARY

However, the stress applied to the organic semiconductor film has not been sufficiently relaxed only by dividing the protective film covering the organic semiconductor film as in JP2011-49221A, and degradation of characteristics due to the stress has not been sufficiently resolved.

It is desirable to provide a semiconductor device, a method of manufacturing the same, and an electronic apparatus that are capable of suppressing degradation of characteristics of an organic semiconductor film due to stress.

According to an embodiment of the present application, there is provided a semiconductor device including: a gate electrode; an organic semiconductor film forming a channel; and a pair of source-drain electrodes formed on the organic semiconductor film, the pair of source-drain electrodes each including a connection layer, a buffer layer, and a wiring layer that are laminated in order.

According to an embodiment of the present application, there is provided a semiconductor device including: a gate electrode; an organic semiconductor film forming a channel; and a pair of source-drain electrodes formed on the organic semiconductor film, the pair of source-drain electrodes each including a connection buffer layer and a wiring layer that are laminated in order, the connection buffer layer including an electric connection material and a buffer material.

According to an embodiment of the present application, there is provided a method of manufacturing a semiconductor device, the method including: forming a gate electrode; forming an organic semiconductor film forming a channel; and forming a connection layer, a buffer layer, and a wiring layer in order as a pair of source-drain electrodes on the organic semiconductor film.

According to an embodiment of the present application, there is provided an electronic apparatus with a display section and a semiconductor device provided to drive the display section, the semiconductor device including: a gate electrode; an organic semiconductor film forming a channel; and a pair of source-drain electrodes formed on the organic semiconductor film, the pair of source-drain electrodes each including a connection layer, a buffer layer, and a wiring layer that are laminated in order.

In the semiconductor device, the method of manufacturing the same, and the electronic apparatus according to the embodiments of the present application, each of the source-drain electrodes has the laminated structure in which the connection layer, the buffer layer, and the wiring layer are layered in this order from the organic semiconductor film side. Thereby, stress applied to the organic semiconductor film is decreased.

According to the semiconductor device, the method of manufacturing the same, and the electronic apparatus of the embodiments of the present application, each of the source-drain electrodes is configured of the plurality of layers including the wiring layer, and the buffer layer is provided between the wiring layer and the organic semiconductor film. Thereby, stress applied from, for example, the wiring layer to the organic semiconductor film is decreased, and degradation of characteristics is allowed to be suppressed.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIG. 1 is a cross-sectional view of a thin film transistor according to a first embodiment of the present disclosure.

FIG. 14 is a perspective view illustrating an appearance of Application example 1 of the thin film transistors of the foregoing embodiments and the like.

DETAILED DESCRIPTION

Figure 2A:
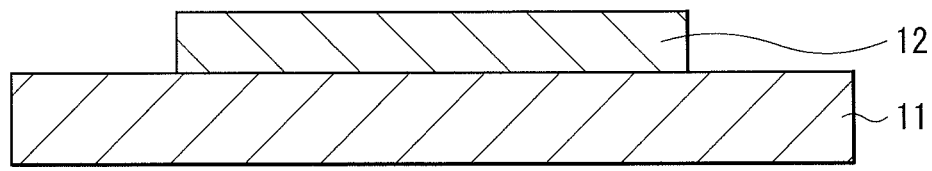
FIG. 2A is a cross-sectional view illustrating a method of manufacturing the thin film transistor illustrated in FIG. 1 in order of steps.

Preferred embodiments of the present disclosure will be described in detail below with reference to the drawings. The description will be given in the following order.

1. First Embodiment (an example of a thin film transistor having a continuous buffer layer: a bottom-gate structure)
1-1. Configuration of Thin Film Transistor
1-2. Manufacturing Method
1-3. Whole Configuration of Semiconductor Device
1-4. Function and Effect
2. Second Embodiment (an example of a thin film transistor having a discontinuous buffer layer)
3. Modification 1 (another example of the manufacturing method)
4. Modification 2 (an example of a thin film transistor having a continuous buffer layer: a top-gate structure)
5. Modification 3 (an example of a thin film transistor having a continuous buffer layer: a top-gate structure)
6. Modification 4 (an example of a thin film transistor in which a connection layer and a mixed layer are integrated as one layer)
7. Application Examples (examples of display units and electronic apparatuses that include circuit substrates)

First Embodiment 1-1. Configuration of Thin Film Transistor

FIG. 1 illustrates a cross-sectional configuration of a bottom-gate and top-contact type thin film transistor (thin film transistor 10) according to a first embodiment of the present disclosure. The thin film transistor 10 is a TFT using an organic semiconductor material as a semiconductor film, and may be used as, for example, a drive element of an organic EL display or the like. In the thin film transistor 10, a gate electrode 12, a gate insulating film 13, an organic semiconductor film (semiconductor film 14) forming a channel region, and a pair of source-drain electrodes (a source electrode 15A and a drain electrode 15B) are provided in this order on a substrate 11. In this embodiment, each of the source electrode 15A and the drain electrode 15B is configured of a plurality of layers (in this case, three layers), and has a configuration in which a connection layer 15a, a buffer layer 15b, and a wiring layer 15c are layered in this order from the semiconductor film 14 side.

For the substrate 11, for example, a plastic substrate made, for example, of polyether sulfone, polycarbonate, polyimides, polyamides, polyacetals, polyethylene terephthalate, polyethylene naphthalate, polyetherether ketone, polyolefins, or the like; a metal foil substrate made, for example, of aluminum (Al), nickel (Ni), copper (Cu), stainless steel, or the like with a surface subjected to insulation treatment; paper, or the like may be used other than a glass substrate. Further, a functional film such as a buffer layer to improve adhesibility and flatness and a barrier film to improve gas-barrier characteristics may be formed on the substrate. Further, if the semiconductor film 14 is allowed to be formed without heating the substrate 11, for example, by a sputtering method or the like, an inexpensive plastic film may be used for the substrate 11.

The gate electrode 12 has a role to apply a gate voltage to the thin film transistor 10 and to control carrier density in the semiconductor film 14 by the gate voltage. The gate electrode 12 is provided in a selective region on the substrate 11, and may be made, for example, of a metal element such as platinum (Pt), titanium (Ti), ruthenium (Ru), molybdenum (Mo), Cu, tungsten (W), nickel (Ni), Al, and tantalum (Ta) or an alloy thereof. Further, the gate electrode 12 may have a structure in which two or more thereof are layered.

The gate insulating film 13 is provided between the gate electrode 12 and the semiconductor film 14, and may have a thickness, for example, from 50 nm to 1 μm both inclusive. The gate insulating film 13 may be formed, for example, of an insulating film including one or more of a silicon oxide film (SiO), a silicon nitride film (SiN), a silicon oxynitride film (SiON), a hafnium oxide film (HfO), an aluminum oxide film (AlO), an aluminum nitride film (AlN), a tantalum oxide film (TaO), a zirconium oxide film (ZrO), a hafnium oxynitride film, a hafnium silicon oxynitride film, an aluminum oxynitride film, a tantalum oxynitride film, and a zirconium oxynitride film. The gate insulating film 13 may have a single-layer structure, or a laminated structure using two or more materials such as SiN and SiO. In the case where the gate insulating film 13 has the laminated structure, interface characteristics with respect to the semiconductor film 14 are allowed to be improved, and intrusion of impurity (such as moisture) from ambient air into the semiconductor film 14 is allowed to be effectively suppressed. The gate insulating film 13 is patterned in a predetermined shape by etching after coating. Alternatively, depending on the material, pattern formation of the gate insulating film 13 may be performed by a printing technology such as ink-jet printing, screen printing, offset printing, and gravure printing.

The semiconductor film 14 is provided on the gate insulating film 13 in the shape of an island, and has a channel region 14C in a position opposed to the gate electrode 12 between the source electrode 15A and the drain electrode 15B. The semiconductor film 14 may have a thickness from 5 nm to 100 nm both inclusive, for example. The semiconductor film 14 may be made, for example, of an organic semiconductor material such as a peri-xanthenoxanthene (PXX) derivative. Examples of the organic semiconductor material may include polythiophene, poly-3-hexylthiophene [P3HT] obtained by introducing a hexyl group to polythiophene, pentacene [2,3,6,7-dibenzo anthracene], polyanthracene, naphthacene, hexacene, heptacene, dibenzo pentacene, tetrabenzo pentacene, chrysene, perylene, coronene, Terrylene, ovalene, quaterrylene, circumanthracene, benzopyrene, dibenzopyrene, triphenylene, polypyrrole, polyaniline, polyacetylene, polydiacetylene, polyphenylene, polyfuran, polyindole, polyvinylcarbazole, polyselenophene, polytellurophene, polyisothianaphthene, polycarbazole, polyphenylene sulfide, polyphenylene vinylene, polyphenylene sulfide, polyvinylene sulfide, polythienylene vinylene, polynaphthalene, polypyrene, polyazurin, phthalocyanine represented by copper phthalocyanine, merocyanine, hemicyanine, polyethylene dioxythiophene, pyridazine, naphthalene tetracarboxylic acid diimide, poly(3,4-ethylene dioxythiophene)/polystyrene sulfonic acid [PEDOT/PSS], 4,4'-biphenyl dithiol (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl)thiophene, 4,4'-diisocyanophenyl, benzidine(biphenyl-4,4'-diamine), TCNQ (tetracyanoquinodimethane), a charge-transfer complex represented by a tetrathiafulvalene (TTF)-TCNQ complex, a bisethylene tetrathiafulvalene, (BEDTTTF)-perchloric acid complex, a BEDTTTF-iodine complex, and a TCNQ-iodine complex, biphenyl-4,4'-dicarboxylic acid, 1,4-di(4-thiophenyl acetylenyl)-2-ethylbenzene, 1,4-di(4-isocyanophenyl acetylenyl)-2-ethylbenzene, dendrimer, fullerene such as C60, C70, C76, C78, and C84, 1,4-di(4-tiohphenylethynyl)-2-ethylbenzene, 2,2"-dihydroxy-1,1':4',1"-terphenyl, 4,4'-biphenyl diethanal, 4,4'-biphenyldiol, 4,4'-biphenylisocyanate, 1,4-diacetenylbenzene, diethylbiphenyl-4,4'-dicarboxylate, benzo[1,2-c;3,4-c';5,6-c"]tris[1,2]dichiol-1,4,7-trithion, alpha-sexithiophene, tetrathiotetracene, tetraselenotetracene, tetratellurtetracene, poly(3-alkylthiophene), poly(3-thiophene-β-ethanesulfonic acid), poly(N-alkylpyrrole)poly(3-alkylpyrrole), poly(3,4-dialkylpyrrole), poly(2,2'-thienylpyrrole), poly(dibenzothiophene sulfide), and quinacridone. In addition thereto, a compound selected from the group consisting of a condensed polycyclic aromatic compound, a porphyrin-based derivative, a phenylvinylidene-based conjugate-system oligomer, and a thiophene-based conjugate-based oligomer may be used. Further, a mixture of an organic semiconductor material and an insulating polymer material may be used.

The semiconductor film 14 may be formed with the use of a vacuum evaporation method. However, the semiconductor film 14 may be preferably formed, for example, with the use of a coating and printing process by dissolving any of the foregoing materials, for example, in an organic solvent and using the resultant as an ink solution. One reason for this is that the coating and printing process reduces cost more than the vacuum evaporation method, and is effective to improve throughput. Specific examples of the coating and printing process include methods such as cast coating, spin coating, spray coating, inkjet printing, relief printing, flexo printing, screen printing, gravure printing, and gravure offset printing.

The source electrode 15A and the drain electrode 15B in a pair are provided on the semiconductor film 14 being separated from each other, and are electrically connected to the semiconductor film 14. In this embodiment, each of the source electrode 15A and the drain electrode 15B is configured of three layers, and has a configuration in which the connection layer 15a, the buffer layer 15b, and the wiring layer 15c are layered in this order from the foregoing semiconductor film 14 side.

For the connection layer 15a, a material having a work function close to a work function of semiconductor may be preferably used. For example, in the case where pentacene is used as semiconductor, a metal material, a metalloid material, or an inorganic semiconductor material having a work function from about 4.8 eV to about 5 eV both inclusive may be used. Specific examples thereof may include gold (Au), silver (Ag), indium tin oxide (ITO), and molybdenum oxide (MoO) in addition to the conductive film materials listed in the foregoing gate electrode 12. The connection layer 15a is made of any of the foregoing metal elements or an alloy thereof. The connection layer 15a may have a single layer structure, or may have a structure obtained by laminating two or more of the foregoing materials. The film thickness of the connection layer 15a may be preferably thin in order to reduce stress applied to the semiconductor film 14. Thereby, even if the work function of the connection layer 15a is close to the work function of semiconductor, when a material with a high resistance is selected, the connection layer has a higher resistance due to such a film thickness. Specifically, for example, the film thickness of the connection layer 15a may be preferably from 2 nm to 15 nm both inclusive, and more preferably equal to or less than 10 nm.

The buffer layer 15b relaxes stress generated at the time of forming the wiring layer 15c, a planarizing layer 16 described later, and the like above the semiconductor film 14, and decreases damage of the semiconductor film 14. In this embodiment, the buffer layer 15b is provided continuously on the connection layer 15a. By forming the buffer layer 15b of a material having electric conductivity, electric connection between the connection layer 15a and the wiring layer 15c is secured. As a material of the buffer layer 15b, a soft material, that is, a material (such as a conductive polymer and metal particles containing a polymer material) capable of relaxing stress of a layer (such as the wiring layer 15c) provided on the buffer layer 15b may be preferably used. Specific examples thereof include a conductive organic polymer such as polyethylene dioxythiophene (PEDOT), polypyrrole, and polyacetylene. Further, ITO, MoO, titanium oxide (TiO), or a conductive inorganic material such as a carbon material such as graphite and carbon nanotube (CNT) may be used. The buffer layer 15b of this embodiment may be formed of any one of the foregoing materials, or may be formed with the use of a mixture of a plurality thereof. Further, for example, it may be preferable that Ag, Ni, C, or CNT in a state of particles be mixed in the foregoing polymer at a rate of several %. By mixing the particulate conductive material as described above, concavity and convexity due to the particles is generated on the surface of the buffer layer 15b, and flatness and smoothness of the surface is lowered. Thereby, stress of the wiring layer 15c and the like provided on the buffer layer 15b is allowed to be further decreased. The film thickness of the buffer layer 15b is not particularly limited as long as the stress of the wiring layer 15c and the like is allowed to be sufficiently buffered, and may be, for example, from 100 nm to 200 nm both inclusive.

The wiring layer 15c is made of a conductive film material similar to that of the forgoing gate electrode 12 as the connection layer 15a is. Further, the wiring layer 15c may have a laminated structure configured of [Ti/Al/Ti], [Mo/Al], or the like. By such a laminated structure, stress of the wiring layer 15c is allowed to be suppressed. However, since processing by etching or the like is difficult, a single-layer film formed of Cu, Au, Ag, or the like may be preferably used, and Cu may be preferably used in terms of manufacturing cost. Although the film thickness of the wiring layer 15c is not particularly limited, the wiring layer 15c may preferably have a film thickness of about 100 nm in order to prevent breaking of wire and the like.

The thin film transistor 10 may be manufactured, for example, as follows.

1-2. Manufacturing Method

First, as illustrated in FIG. 2A, a metal film to become the gate electrode 12 may be formed on the whole surface of the substrate 11 with the use of, for example, a sputtering method or a vacuum evaporation method. Next, the metal film may be patterned with the use of, for example, photolithography and etching to form the gate electrode 12.

Figure 2B:
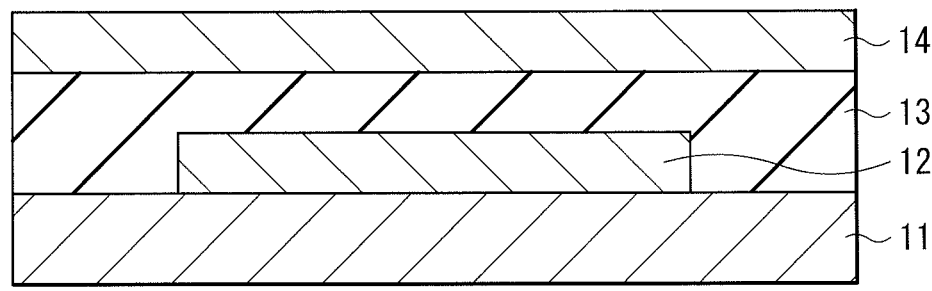
FIG. 2B is a cross-sectional view illustrating a step following a step of FIG. 2A.

Subsequently, as illustrated in FIG. 2B, the gate insulating film 13 and the semiconductor film 14 are formed in this order on the whole surfaces of the substrate 11 and the gate electrode 12. Specifically, the whole surface of the substrate 11 may be coated with the foregoing gate insulating film material such as a PVP (polyvinylpyrrolidone) solution with the use of, for example, a spin coating method, and the resultant is dried. Next, the gate insulating film 13 is coated with an organic semiconductor material such as a PXX compound solution. Thereafter, the applied organic semiconductor material is heated, and thereby, the semiconductor film 14 is formed on the gate insulating film 13.

Figure 2C:
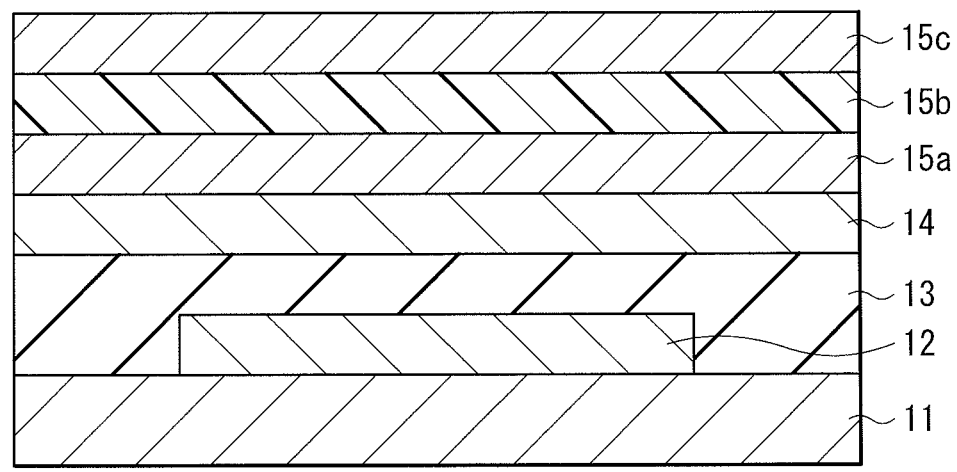
FIG. 2C is a cross-sectional view illustrating a step following the step of FIG. 2B.

Subsequently, as illustrated in FIG. 2C, metal films are formed on the semiconductor film 14. Specifically, a Cu film (the connection layer 15a), a PEDOT film (the buffer layer 15b), and a Cu film (the wiring layer 15c) may be formed in this order with the use of, for example, a sputtering method.

Figure 2D:
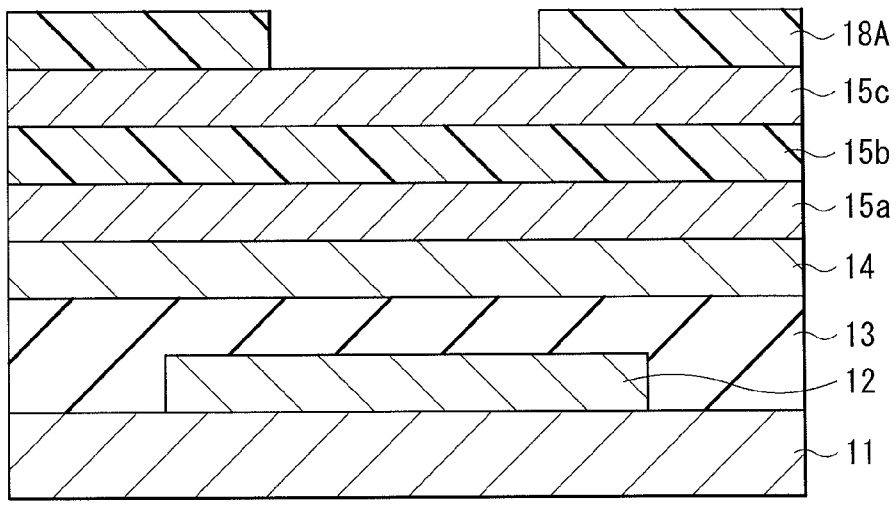
FIG. 2D is a cross-sectional view illustrating a step following the step of FIG. 2C.
Figure 2E:
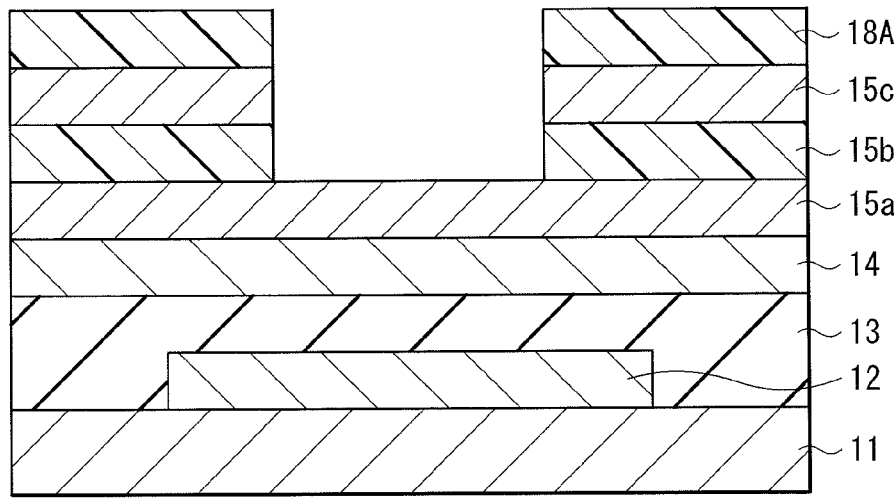
FIG. 2E is a cross-sectional view illustrating a step following the step of FIG. 2D.
Figure 2F:
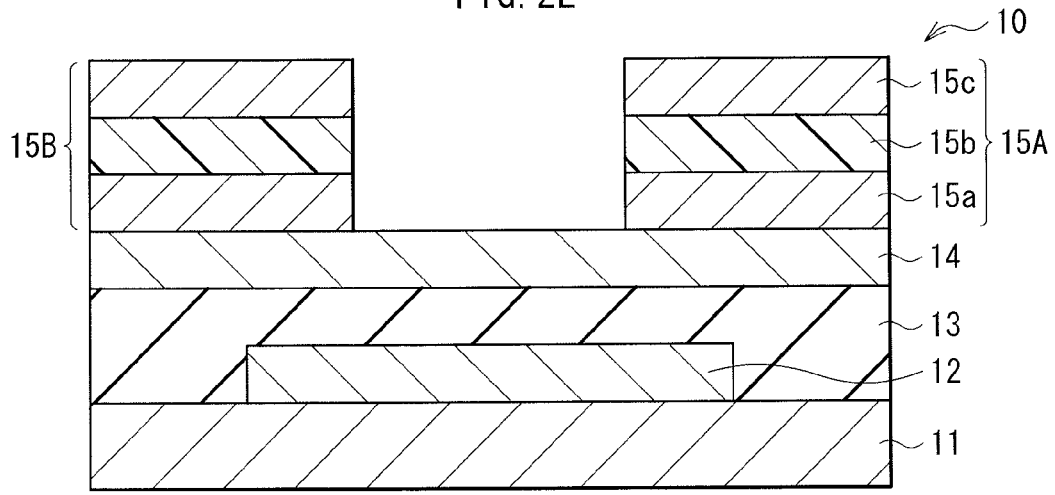
FIG. 2F is a cross-sectional view illustrating a step following the step of FIG. 2E.

Next, as illustrated in FIG. 2D to FIG. 2F, the source electrode 15A and the drain electrode 15B in a pair may be formed by etching with the use of, for example, a photolithography method. Specifically, the Cu film to become the wiring layer 15c is coated with a resist 18A, and the resultant is patterned in a predetermined shape. Subsequently, first, the Cu film is wet-etched to perform patterning of the wiring layer 15c, and thereafter, the PEDOT film may be patterned by, for example, oxygen ($O_2$) dry etching to form the buffer layer 15b. Next, wet etching is performed again, the Cu film is patterned to form the connection layer 15a, and thereafter, the resist 18A is peeled off. Accordingly, the thin film transistor 10 having the source electrode 15A and the drain electrode 15B that are configured of a plurality of layers on the substrate 11 is completed.

1-3. Whole Configuration of Semiconductor Device

Figure 3:
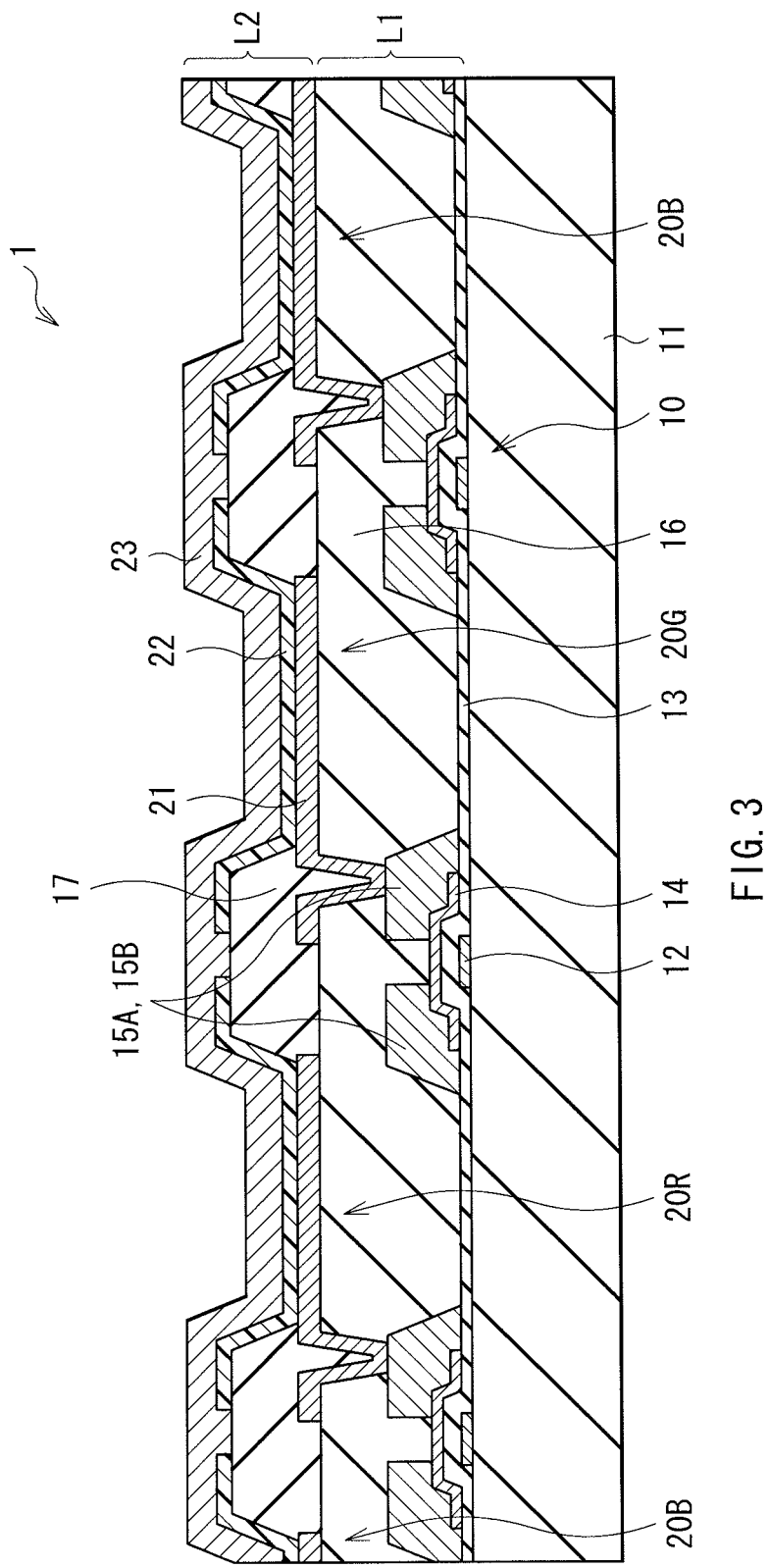
FIG. 3 is a cross-sectional view of a display unit including the thin film transistor illustrated in FIG. 1.

FIG. 3 illustrates a cross-sectional configuration of a semiconductor device (a display unit 1, in this example) including the foregoing thin film transistor 10 as a drive element. The display unit 1 is a self-luminous type display unit including a plurality of organic light emitting devices 20R, 20G, and 20B (devices). The display unit 1 has a pixel drive circuit formation layer L1, a light emitting device formation layer L2 including the organic light emitting devices 20R, 20G, and 20B, and an opposed substrate (not illustrated) in this order on the substrate 11. The display unit 1 is a top-emission type display unit in which light is extracted from the opposed substrate side. The thin film transistor 10 is included in the pixel drive circuit formation layer L1.

Figure 4:
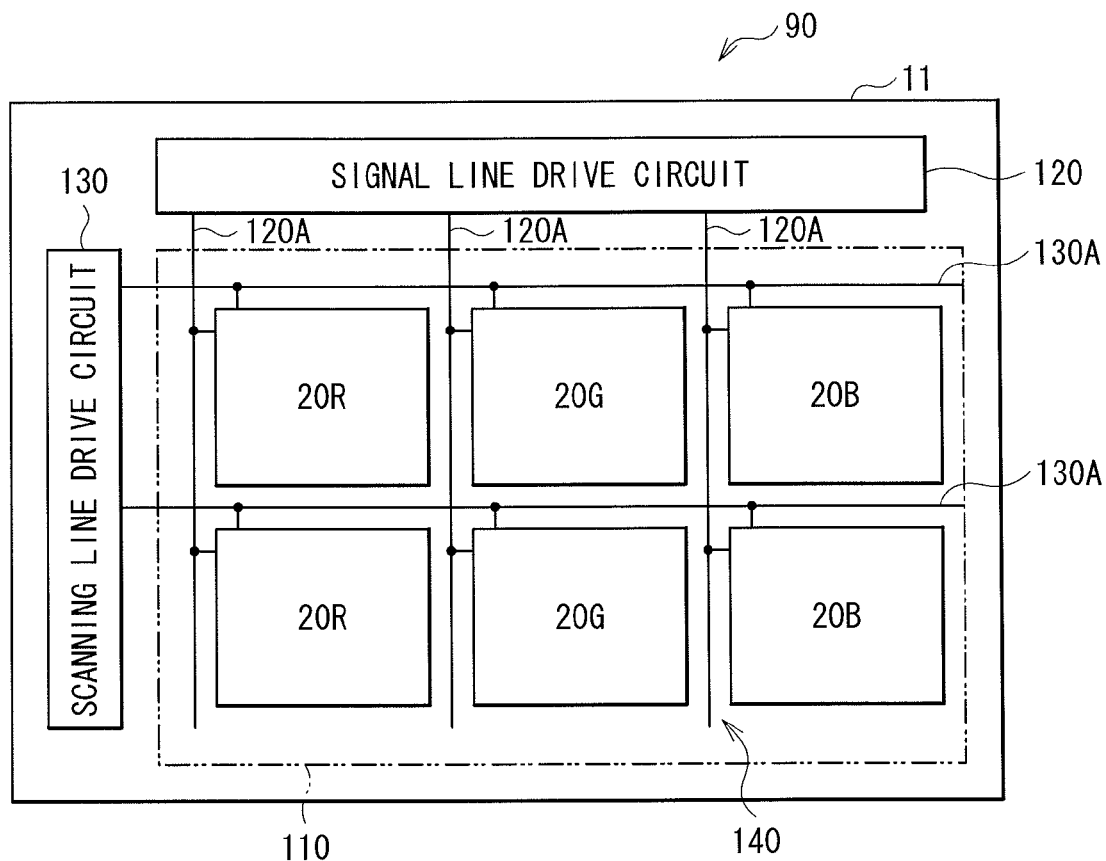
FIG. 4 is a view illustrating a whole configuration of the display unit illustrated in FIG. 3.

FIG. 4 illustrates a whole configuration of the display unit 1. The display unit 1 has a display region 110 on the substrate 11, and is used as an ultrathin-type organic light emitting color display unit or the like. Around the display region 110 on the substrate 11, for example, a signal line drive circuit 120 and a scanning line drive circuit 130 that are drivers for displaying an image may be provided.

In the display region 110, the plurality of organic light emitting devices 20R, 20G, and 20B that are two-dimensionally arranged in a matrix state and a pixel drive circuit 140 for driving the organic light emitting devices 20R, 20G, and 20B are formed. In the pixel drive circuit 140, a plurality of signal lines 120A are arranged in a column direction, and a plurality of scanning lines 130A are arranged in a row direction. One of the organic light emitting devices 20R, 20G, and 20B is provided correspondingly to each intersection of each signal line 120A and each scanning line 130A. Each signal line 120A is connected to the signal line drive circuit 120, and each scanning line 130A is connected to the scanning line drive circuit 130.

The signal line drive circuit 120 supplies a signal voltage of an image signal corresponding to luminance information supplied from a signal supply source (not illustrated) to the organic light emitting devices 20R, 20G, and 20B selected through the signal line 120A.

The scanning line drive circuit 130 is configured of a shift resistor or the like that sequentially shifts (transfers) a start pulse in synchronization with an inputted clock pulse. The scanning line drive circuit 130 scans the organic light emitting devices 20R, 20G, and 20B in units of row upon writing of an image signal into the organic light emitting devices 20R, 20G, and 20B, and sequentially supplies a scanning signal to each scanning line 130A.

Figure 5:
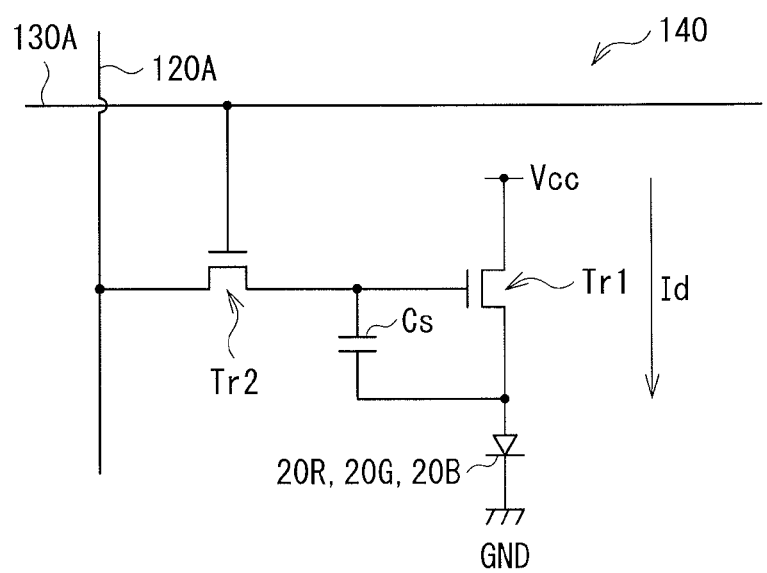
FIG. 5 is a circuit diagram illustrating an example of a pixel drive circuit illustrated in FIG. 4.

The pixel drive circuit 140 is provided in a layer between the substrate 11 and the organic light emitting devices 20R, 20G, and 20B, that is, in the pixel drive circuit formation layer L1. As illustrated in FIG. 5, the pixel drive circuit 140 is an active drive circuit having a drive transistor Tr1 and a writing transistor Tr2, one or both of which are configured of the thin film transistor 10, a retentive capacity Cs between the drive transistor Tr1 and the writing transistor Tr2, and the organic light emitting devices 20R, 20G, and 20B.

Next, a description will be given of detailed configurations of the pixel drive circuit formation layer L1, the light emitting device formation layer L2, and the like referring to FIG. 3 again.

In the pixel drive circuit formation layer L1, the thin film transistor 10 (the drive transistor Tr1 and the writing transistor Tr2) configuring the pixel drive circuit 140 is formed. Further, the signal line 120A and the scanning line 130A are buried therein as well. More specifically, the thin film transistor 10 and the planarizing layer 16 are provided in this order on the substrate 11. The planarizing layer 16 is provided mainly to planarize the surface of the pixel drive circuit formation layer L2, and may be made, for example, of an insulating resin material such as polyimide.

In the light emitting device formation layer L2, the organic light emitting devices 20R, 20G, and 20B and a device separation film 17, and a sealing layer (not illustrated) covering the organic light emitting devices 20R, 20G, and 20B and the device separation film 17 are provided. In the organic light emitting devices 20R, 20G, and 20B, a first electrode 21 as an anode electrode, an organic layer 22 including a light emitting layer, and a second electrode 23 as a cathode electrode are laminated in this order from the substrate 11 side. The organic layer 22 may have, for example, a hole injection layer, a hole transport layer, a light emitting layer, and an electron transport layer in this order from the first electrode 21 side. The light emitting layer may be provided for each device, or may be provided commonly to the respective devices. The layers other than the light emitting layer may be provided as necessary. The device separation film 17 is made of an insulating material. The device separation film 17 separates the respective organic light emitting devices 20R, 20G, and 20B for every organic light emitting device, and defines respective light emitting regions of the organic light emitting devices 20R, 20G, and 20B.

The foregoing display unit 1 is applicable to a display unit of an electronic apparatus in any field for displaying an image signal inputted from outside or an image signal generated inside as an image or a video such as a television, a digital camera, a notebook personal computer, a portable terminal device such as a mobile phone, and a video camcorder.

1-4. Function and Effect

In the thin film transistor using the organic semiconductor material as a semiconductor film as in this embodiment, the characteristics thereof are degraded by exposing the semiconductor film to the atmosphere. One reason for this is that oxygen and moisture in the atmosphere intrude into the semiconductor film. Therefore, a semiconductor protective film or the like made of an oxide or a resin material has been provided on the semiconductor film in the past. However, in that case, there is a disadvantage that stress is generated at the time of forming the semiconductor protective film, leading to damage of the semiconductor film.

To address the foregoing disadvantage, in the foregoing JP2011-49221A, the method of relaxing stress by dividing the semiconductor protective film to obtain the laminated structure is disclosed. However, the stress applied to the semiconductor film may be favorable to be controlled as a whole device. For example, the stress applied to the semiconductor film is not only due to the semiconductor protective film provided directly above the semiconductor film after forming the semiconductor film. The stress is also generated at the time of forming an electrode such as a source electrode and a drain electrode, leading to damage of the semiconductor film and degraded characteristics.

In contrast, in the thin film transistor 10 configuring the semiconductor device 1 in this embodiment, the source electrode 15A and the drain electrode 15B in a pair provided on the semiconductor film 14 are configured of the plurality of layers (in this example, three layers of the connection layer 15a, the buffer layer 15b, and the wiring layer 15c). In particular, by providing the buffer layer 15b between the semiconductor film 14 and the wiring layer 15c, the stress generated at the time of forming the wiring layer 15c, the planarizing layer 16, and the like is relaxed. Thereby, damage of the semiconductor film 14 by the stress is allowed to be suppressed.

As described above, in the thin film transistor 10 in this embodiment, the source electrode 15A and the drain electrode 15B are configured of the plurality of layers including the wiring layer 15c, and the buffer layer 15b is provided between the wiring layer 15c and the semiconductor film 14. Thereby, the stress generated at the time of forming the wiring layer 15c, the planarizing layer 16, and the like is relaxed by the buffer layer 15b, and the stress applied to the semiconductor film 14 is decreased. Therefore, degradation of the characteristics of the semiconductor device 1 including the thin film transistor 10 of this embodiment is allowed to be suppressed.

Further, metal having high hardness or metal having high linear expansion coefficient may be selected, and degree of freedom for selecting a material is improved.

Next, a description will be given of thin film transistors 30 (30A, 30B, and 30C), 40, 50, 60, and 70 according to a second embodiment and modifications thereof (Modifications 1 to 4). It is to be noted that, in the following description, for the same components as those in the foregoing embodiment, the same referential symbols are affixed thereto, and the description thereof will be omitted as appropriate.

Second Embodiment

Figure 6:
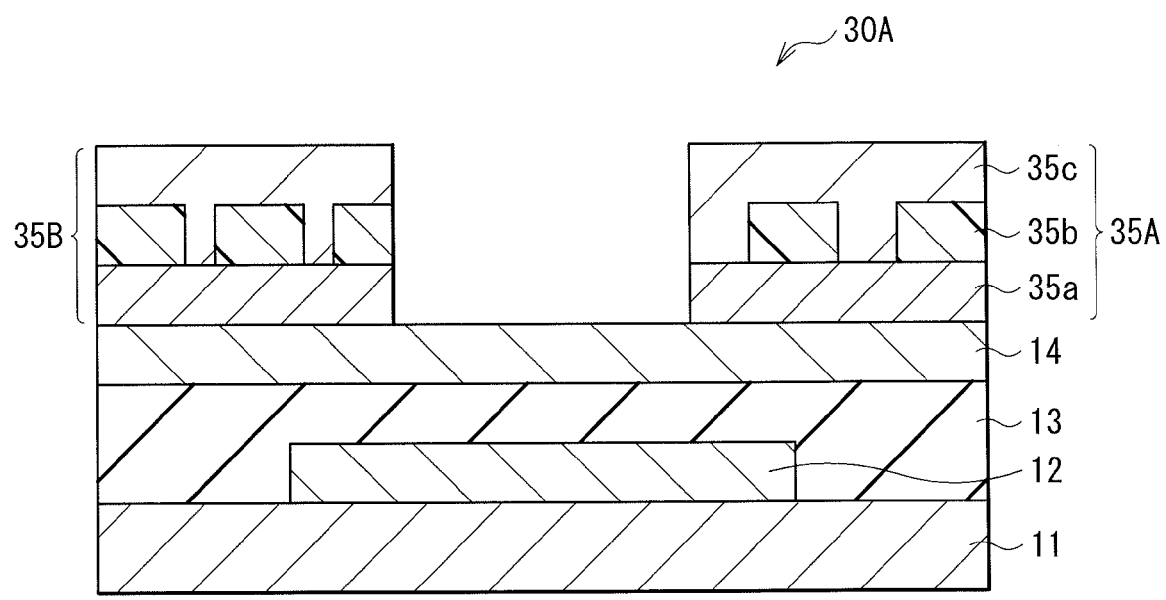
FIG. 6 is a cross-sectional view of a thin film transistor according to a second embodiment of the present disclosure.

FIG. 6 illustrates a cross-sectional configuration of a bottom-gate and top-contact type thin film transistor (thin film transistor 30A) according to the second embodiment of the present disclosure. In the thin film transistor 30A, as in the foregoing first embodiment, each of a source electrode 35A and a drain electrode 35B in a pair has a three-layer structure in which a connection layer 35a, a buffer layer 35b, and a wiring layer 35c are laminated in this order from the semiconductor film 14 side. However, the second embodiment is different from the first embodiment in that the buffer layer 35b has a discontinuous structure, that is, an island-like structure, and the connection layer 35a and the wiring layer 35c are directly connected in part.

As a material of the buffer layer 35b, an insulating material such as Si beads may be used in addition to the materials listed in the foregoing first embodiment.

Figure 7A:
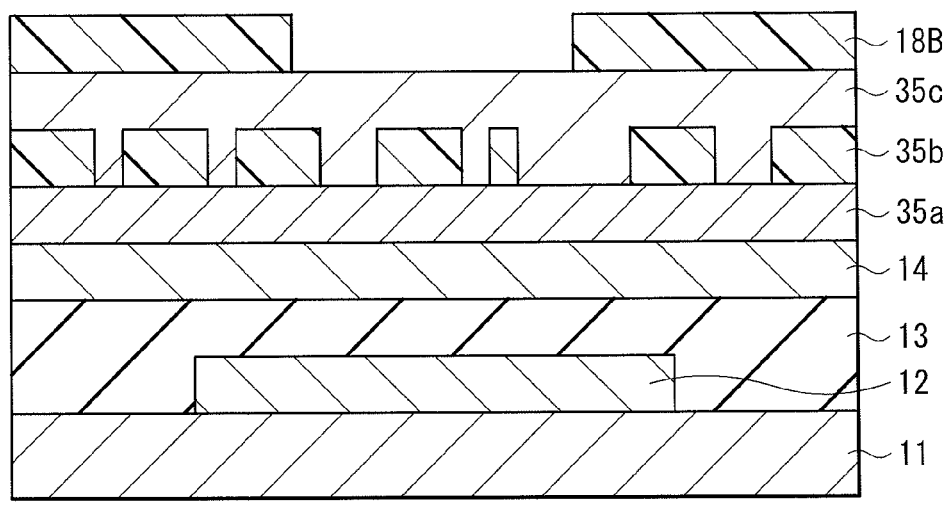
FIG. 7A is a cross-sectional view illustrating a method of manufacturing the thin film transistor illustrated in FIG. 6 in order of steps.
Figure 7B:
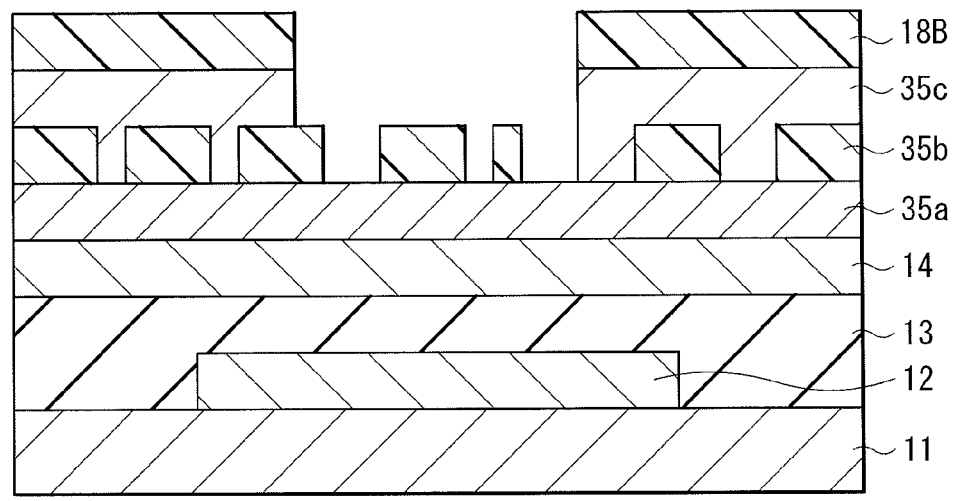
FIG. 7B is a cross-sectional view illustrating a step following a step of FIG. 7A.
Figure 7C:
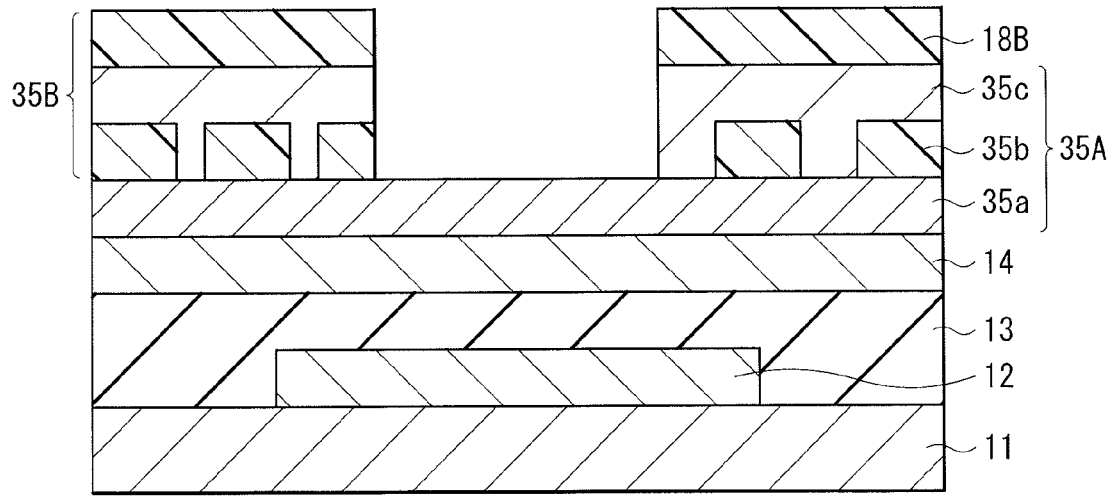
FIG. 7C is a cross-sectional view illustrating a step following the step of FIG. 7B.

The thin film transistor 30A in this embodiment may be manufactured as illustrated in FIG. 7A to FIG. 7C, for example. It is to be noted that steps until forming the semiconductor film 14 are similar to those of the foregoing first embodiment, and therefore, descriptions thereof will be omitted.

First, after the semiconductor film 14 is formed, a metal film is formed. Specifically, a Cu film (the connection layer 35a) may be formed on the semiconductor film 14 with the use of, for example, a sputtering method. Thereafter, the Cu film may be coated, for example, with a solution obtained by dispersing Si beads, and the resultant is dried. As a solvent in which the Si beads are dispersed is removed, a Si bead film (buffer layer 35b) in a state of an island is formed. Subsequently, on the Si bead film and the Cu film, a Cu film (the wiring layer 35c) may be formed with the use of, for example, a sputtering method. Thereafter, the Cu film is coated with a resist 18B, and the resultant is patterned in a predetermined shape (FIG. 7A).

Next, as illustrated in FIG. 7B, the Cu film is wet-etched to perform patterning of the wiring layer 35c. Subsequently, as illustrated in FIG. 7C, an unnecessary portion of the Si bead film may be removed by dry etching with the use of, for example, $CF_4$ to form the buffer layer 35b. Thereafter, the Cu film is wet-etched to form the connection layer 35a. Finally, the resist 18B is peeled off, and thereby, the thin film transistor 30A illustrated in FIG. 6 is completed.

Figure 8:
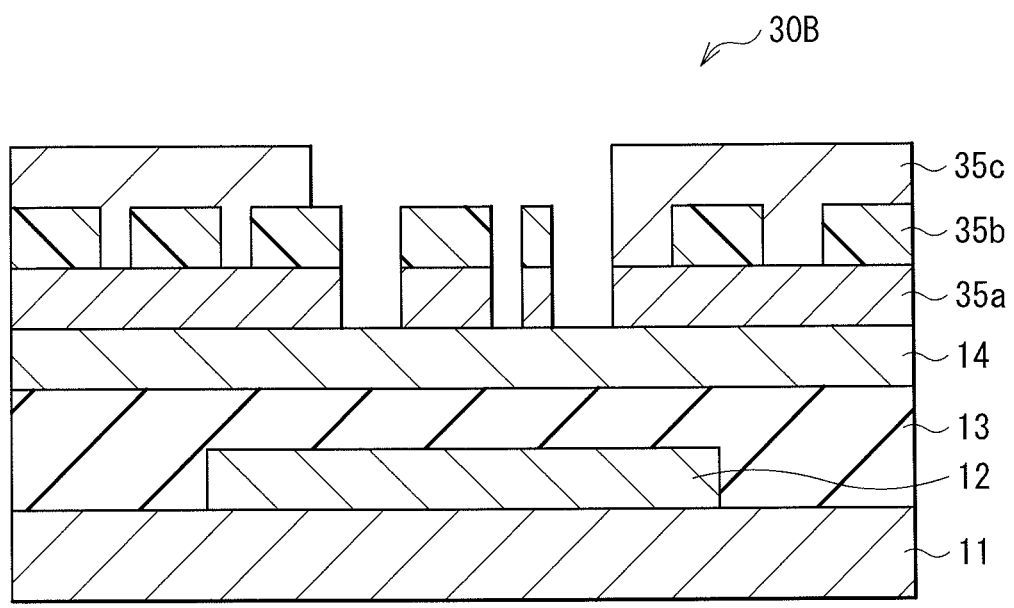
FIG. 8 is a cross-sectional view illustrating another example of the step following the step of FIG. 7A.

In this example, the wiring layer 35c, the buffer layer 35b, and the connection layer 35a are processed in this order. However, in the case where the connection layer 35a and the wiring layer 35c are made of the same material, the electrodes may be processed by one-time etching as illustrated in FIG. 8 after forming the resist 18B on the Cu film (FIG. 7A). Further, in a thin film transistor 30B manufactured by such a one-time etching, as illustrated in FIG. 8, an island structure configured of [Cu/Si] remains between the source electrode 35A and the drain electrode 35B. However, such an island structure is not continuous with the source electrode 35A and the drain electrode 35B, and therefore, such an island structure does not influence an operation of the device.

As described above, in this embodiment, the buffer layer 35b configuring the source electrode 35A and the drain electrode 35B is formed in the shape of an island. Thereby, the connection layer 35a and the wiring layer 35c are directly connected. Therefore, this embodiment achieves an effect that room for choice of a material used for the buffer layer 35b is enlarged, in addition to the effect of the foregoing first embodiment. Further, since the buffer layer 35b is provided in a discontinuous manner, concavity and convexity level is increased. Therefore, concavity and convexity of the wiring layer 35c are also increased, and heat stress of the wiring layer itself is relaxed as well.

[Modification 1]

Figure 9A:
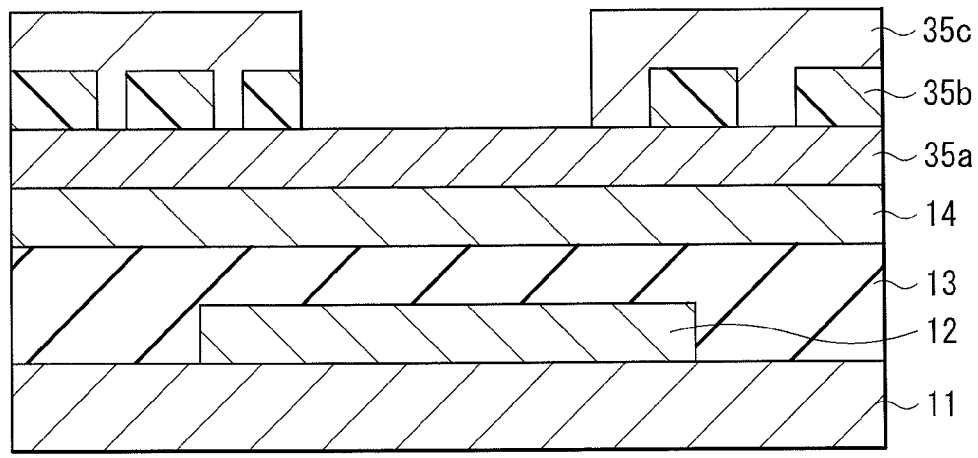
FIG. 9A is a cross-sectional view illustrating a method of manufacturing a thin film transistor according to Modification 1 in order of steps.
Figure 9B:
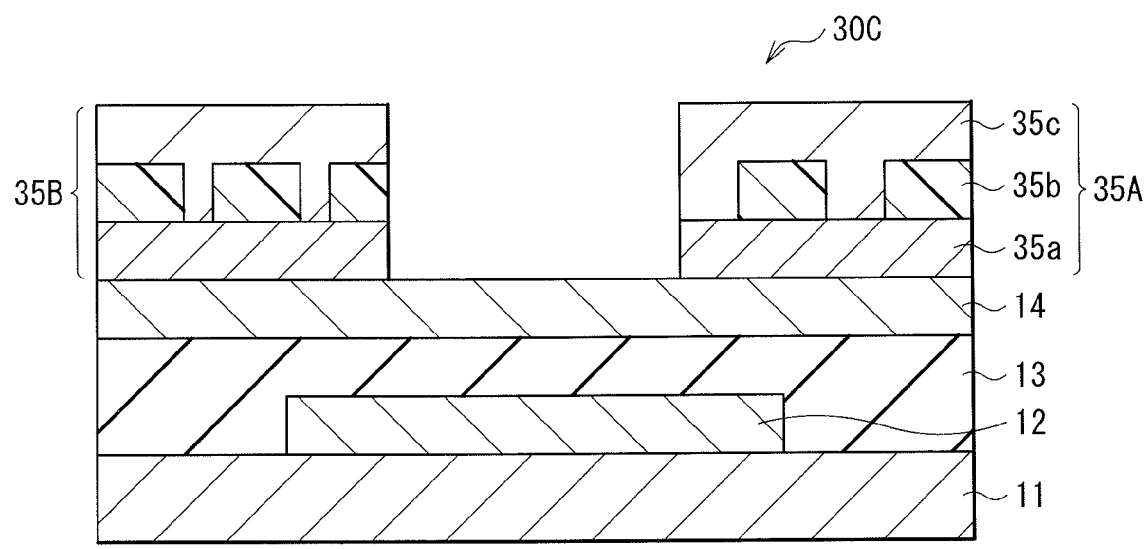
FIG. 9B is a cross-sectional view illustrating a step following a step of FIG. 9A.

FIG. 9A and FIG. 9B are cross-sectional views for explaining manufacturing steps of a thin film transistor (a thin film transistor 30C) according to Modification 1 of the embodiments of the present disclosure. In the thin film transistor 30C, the buffer layer 35b has an island-like structure as in the foregoing second embodiment. However, Modification 1 is different form the foregoing first embodiment and the foregoing second embodiment in that the buffer layer 35b and the wiring layer 35c are formed by a printing method.

In the thin film transistor 30C in this modification, a metal film (such as Cu) to become the connection layer 35a is formed by an evaporation method, and thereafter, as illustrated in FIG. 9A, the buffer layer 35b and the wiring layer 35c are formed in this order with the use of a printing method such as offset. Thereafter, as illustrated in FIG. 9B, the metal film may be, for example, wet-etched with the use of the laminated structure configured of the buffer layer 35b and the wiring layer 35c that are patterned as a mask to form the connection layer 35a. Accordingly, the thin film transistor 30C is obtained.

As described above, the buffer layer 35b and the wiring layer 35c are formed with the use of a printing method. Thereby, steps of forming the resist 18B, peeling off the resist 18B, and the like that are described in the foregoing first embodiment and the foregoing second embodiment are allowed to be shortened. Therefore, manufacturing steps are allowed to be reduced. Further, room for choice of a material used for the wiring layer 35c is enlarged.

[Modification 2]

Figure 10:
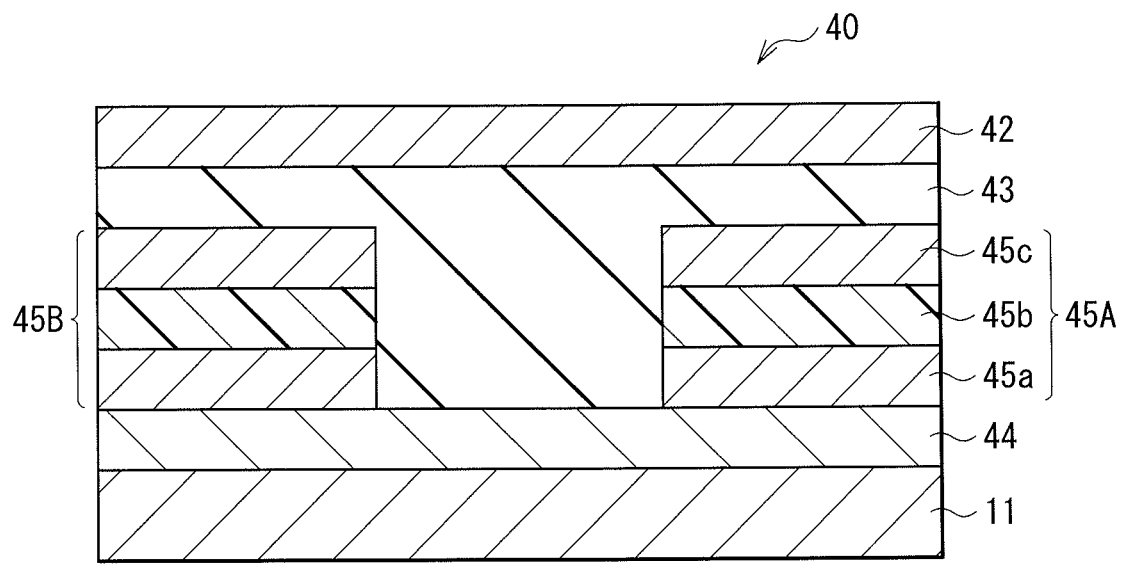
FIG. 10 is a cross-sectional view of a thin film transistor according to Modification 2.

FIG. 10 is a cross-sectional configuration of a top-gate and top-contact type thin film transistor (a thin film transistor 40) according to Modification 2 of the embodiments of the present disclosure. In the thin film transistor 40, a semiconductor film 44, a pair of source-drain electrodes (a source electrode 45A and a drain electrode 45B), a gate insulating film 43, and a gate electrode 42 are provided in this order on the substrate 11. In this Modification 2, each of the source electrode 45A and the drain electrode 45B has a three-layer structure in which a connection layer 45a, a buffer layer 45b, and a wiring layer 45c are layered in this order from the semiconductor film 44 side. In this example, the buffer layer 45b is formed on the connection layer 44a as a continuous film as in the foregoing first embodiment.

[Modification 3]

Figure 11:
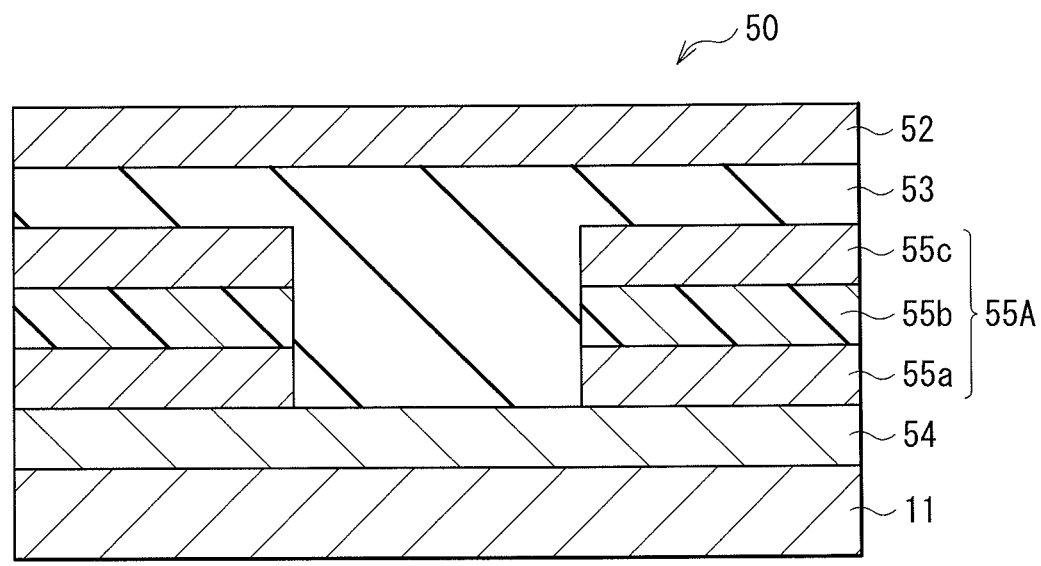
FIG. 11 is a cross-sectional view of a thin film transistor according to Modification 3.

FIG. 11 is a cross-sectional configuration of a top-gate and top-contact type thin film transistor (a thin film transistor 50) according to Modification 3 of the embodiments of the present disclosure. The thin film transistor 50 has a laminated structure similar to that of the thin film transistor 40 in the foregoing Modification 2. In this modification, a buffer layer 55b configuring a source electrode 55A and a drain electrode 55B has an island-like structure as in the foregoing second embodiment.

[Modification 4]

Figure 12:
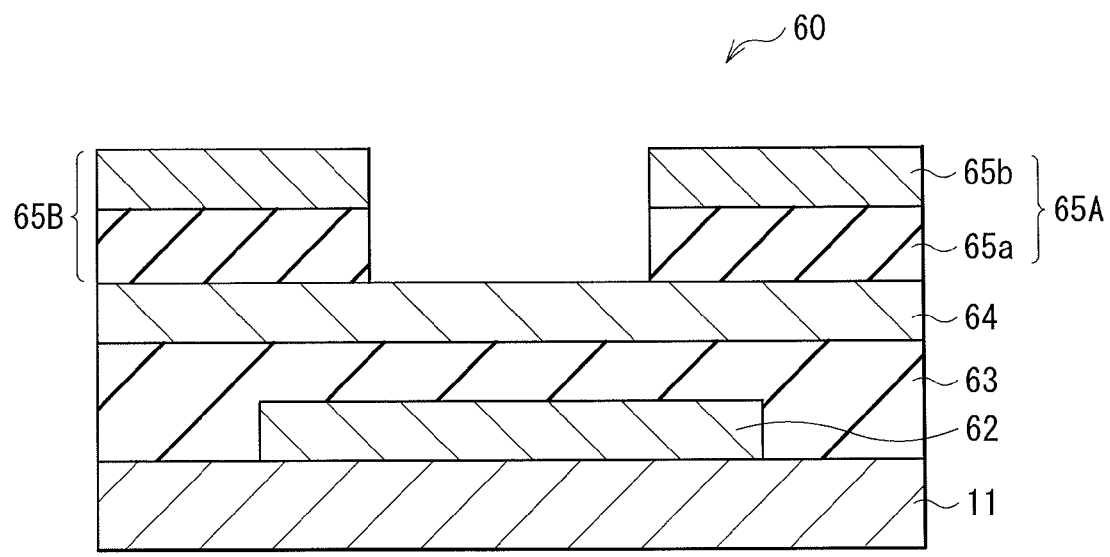
FIG. 12 is a cross-sectional view illustrating an example of a thin film transistor according to Modification 4.

FIG. 12 illustrates a cross-sectional configuration of a bottom-gate and top-contact type thin film transistor (thin film transistor 60) according to Modification 4 of the embodiments of the present disclosure. The thin film transistor 60 is different from the foregoing embodiments and the like in that each of a source electrode 65A and a drain electrode 65B in a pair has a two-layer structure in which a connection buffer layer 65a and a wiring layer 65b are laminated in this order from a semiconductor film 64 side.

The connection buffer layer 65a is a layer having functions of a connection layer (such as the connection layer 15a) and a buffer layer (such as the buffer layer 15b) that are described in the foregoing embodiments and the like. Specifically, the connection buffer layer 65a is a mixed layer (single layer) formed by mixing a connection material and a buffer material as appropriate. Examples of the connection material may include the materials capable of electric connection listed for the connection layer 15a. Examples of the buffer material include the conducive organic materials and the conductive inorganic materials listed for the buffer layer 15b and the insulating materials described in the second embodiment.

Figure 13:
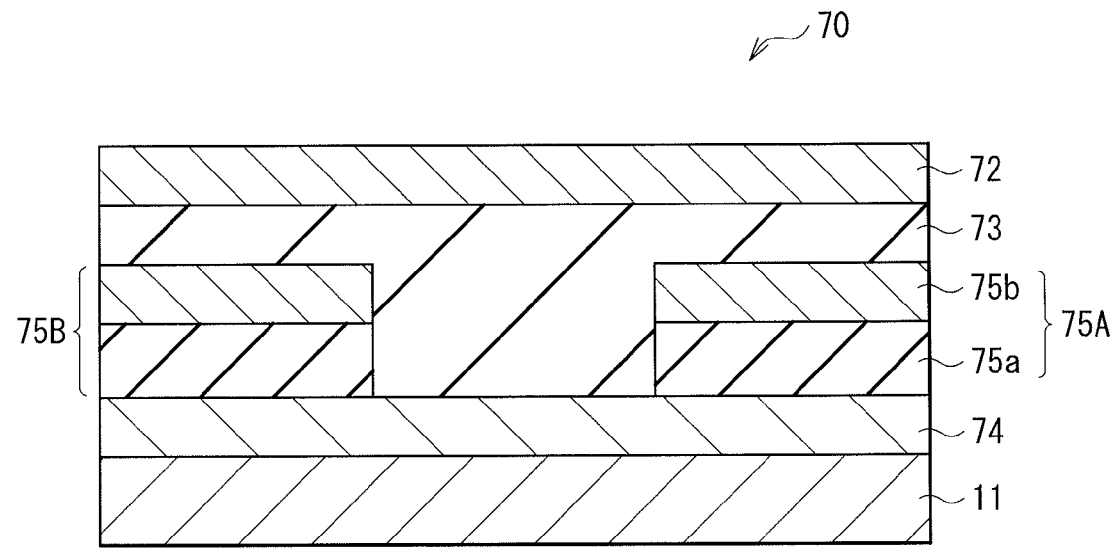
FIG. 13 is a cross-sectional view illustrating another example of the thin film transistor according to Modification 4.

It is to be noted that the connection buffer layer 65a obtained by integrating the connection layer and the buffer layer as one layer as in this modification is also applicable to a top-gate and top-contact type thin film transistor (thin film transistor 70) illustrated in the foregoing Modifications 2 and 3, as illustrated in FIG. 13.

As described above, by providing the connection buffer layer 65a obtained by mixing the material of the connection layer and the material of the buffer layer between the semiconductor film 64 and the wiring layer 65b, manufacturing steps are allowed to be shortened.

As described above, each of the source electrodes 45A and 55A and the drain electrodes 45B and 55B in a pair, respectively, has the three-layer structure, and the buffer layers 45b and 55b are provided between the wiring layers 45c and 55c and the organic semiconductor films 44 and 54, respectively. Thereby, the stress applied to the organic semiconductor film of the top-contact type thin film transistor having the source-drain electrodes on the organic semiconductor film is relaxed, and degradation of the characteristics is allowed to be suppressed.

APPLICATION EXAMPLES

Figure 14:
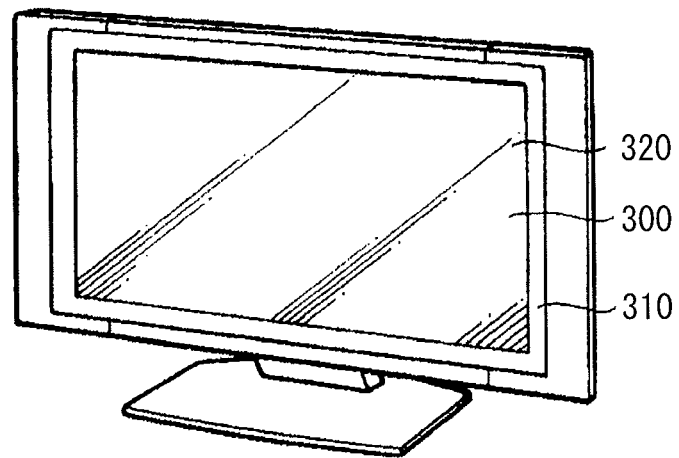

The semiconductor devices including the thin film transistors 10, 30, 40, 50, 60, and 70 described in the first and the second embodiments and Modifications 1 to 3 may be suitably used as a display unit. Examples of the display unit include a liquid crystal display unit, an organic EL display unit, and an electronic paper display. FIG. 14 schematically illustrates an example of a display drive circuit.

Application Example 1

FIG. 14 illustrates an appearance of a television according to Application example 1. The television may have, for example, an image display screen section 300 including a front panel 310 and a filter glass 320. The image display screen section 300 corresponds to the foregoing display unit.

Application Example 2

Figure 15A:
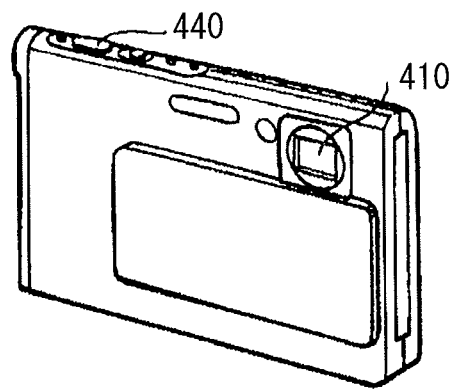
FIG. 15A is a perspective view illustrating an appearance viewed from the front side of Application example 2.
Figure 15B:
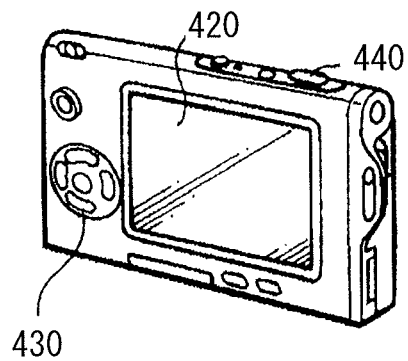
FIG. 15B is a perspective view illustrating an appearance viewed from the rear side of Application example 2.

FIG. 15A illustrates an appearance of a digital camera according to Application example 2 that is viewed from the front side, and FIG. 15B illustrates the appearance thereof that is viewed from the rear side. The digital camera may have, for example, a light emitting section 410 for a flash, a display section 420 as the foregoing display unit, a menu switch 430, and a shutter button 440.

Application Example 3

Figure 16:
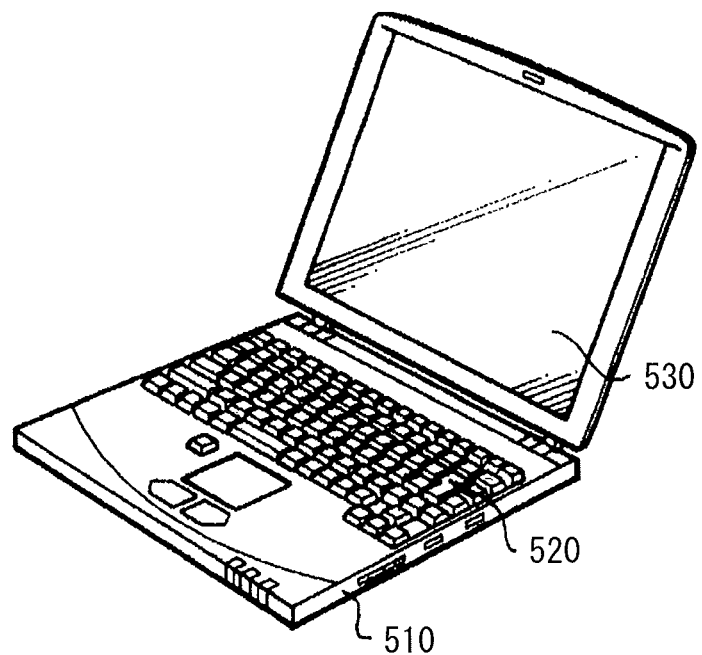
FIG. 16 is a perspective view illustrating an appearance of Application example 3.

FIG. 16 illustrates an appearance of a notebook personal computer according to Application example 3. The notebook personal computer may have, for example, a main body 510, a keyboard 520 for operation of inputting characters and the like, and a display section 530 as the foregoing display unit.

Application Example 4

Figure 17:
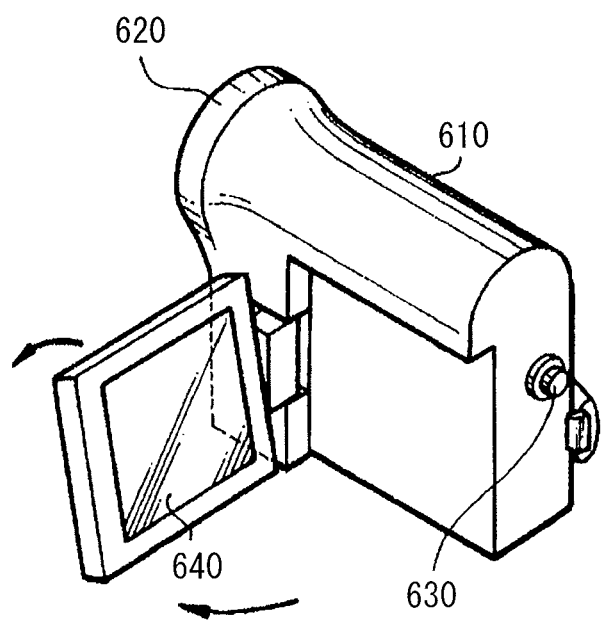
FIG. 17 is a perspective view illustrating an appearance of Application example 4.

FIG. 17 illustrates an appearance of a video camcorder according to Application example 4. The video camcorder may have, for example, a main body 610, a lens 620 for shooting a subject provided on the front side surface of the main body 610, a start-stop switch 630 for shooting, and a display section 640 as the foregoing display unit.

Application Example 5

Figure 18A:
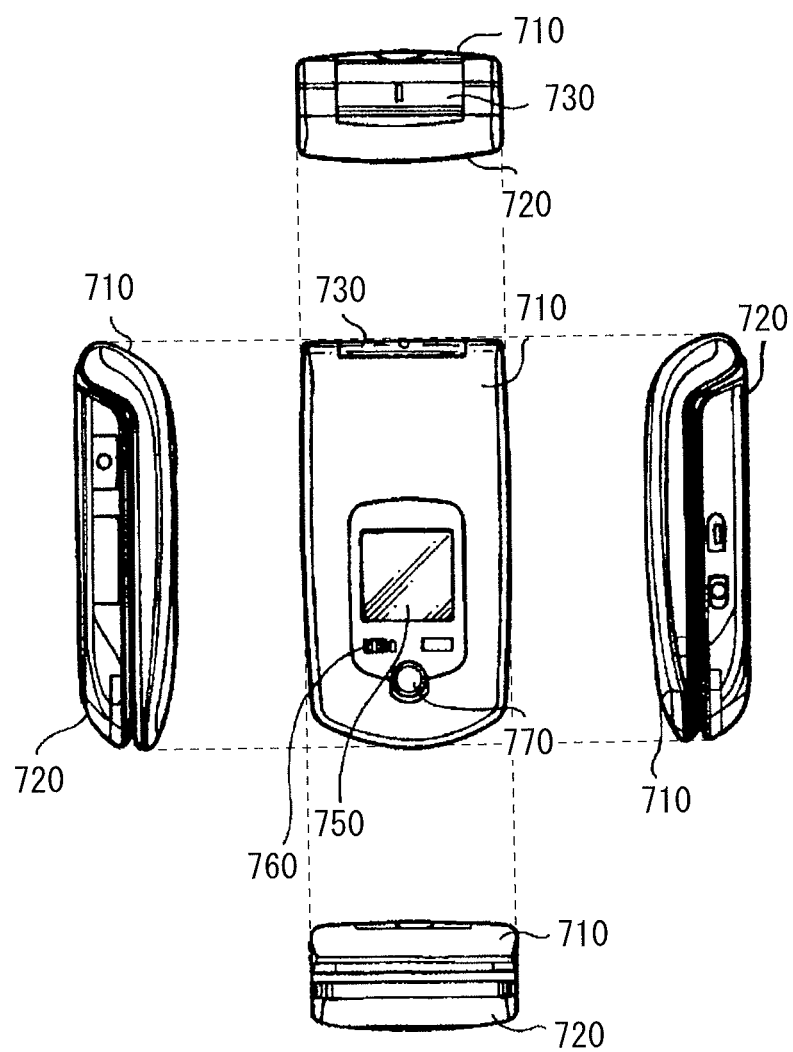
FIG. 18A illustrates an elevation view of Application example 5 in a closed state, a left side view thereof, a right side view thereof, a top view thereof, and a bottom view thereof.
Figure 18B:
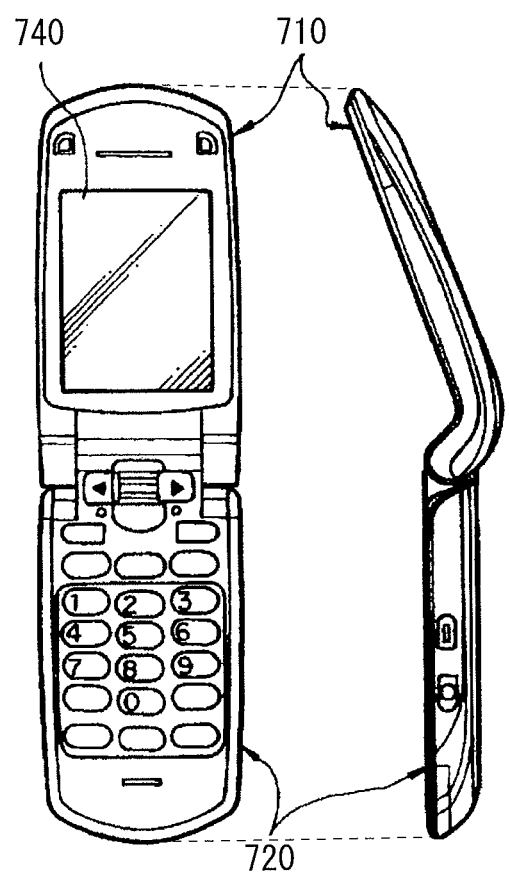
FIG. 18B illustrates an elevation view of Application example 5 in an open state and a side view thereof.

FIG. 18A illustrates an elevation view of a mobile phone according to Application example 5 in a closed state, a left side view thereof, a right side view thereof, a top view thereof, and a bottom view thereof. FIG. 18B illustrates an elevation view of the mobile phone in an open state and a side view thereof. In the mobile phone, for example, an upper package 710 and a lower package 720 may be jointed by a joint section (hinge section) 730. The mobile phone may have a display 740, a sub-display 750, a picture light 760, and a camera 770. Either one or both of the display 740 and the sub-display 750 corresponds to the foregoing display unit 1.

While the present application has been described with reference to the preferred embodiments, Modifications 1 to 4, and the application examples, the present disclosure is not limited to the foregoing embodiments and the like, and various modifications may be made. For example, the material, the thickness, the film-forming method, the film-forming conditions, and the like of each layer are not limited to those described in the foregoing embodiments and the like, and other material, other thickness, other film-forming method, and other film-forming conditions may be adopted.

Further, for example, in the foregoing embodiments and the like, the description has been specifically given of the configurations of the thin film transistors 10, 30, 40, 50, 60, and 70. However, the thin film transistors 10, 30, 40, 50, 60, and 70 may further include other layer. For example, in the foregoing embodiments and the like, the pair of source-drain electrodes (the source electrode 15A and the drain electrode 15B) is directly provided on the organic semiconductor film (such as the semiconductor film 14). However, the foregoing protective film may be formed between the pair of source-drain electrodes and the organic semiconductor film. In this case, the protective film may be preferably made of an inorganic insulating film or a fluorine resin.

It is possible to achieve at least the following configurations from the above-described example embodiments and the modifications of the disclosure.

(1) A semiconductor device including:
 a gate electrode;
 an organic semiconductor film forming a channel; and
 a pair of source-drain electrodes formed on the organic semiconductor film, the pair of source-drain electrodes each including a connection layer, a buffer layer, and a wiring layer that are laminated in order.
(2) The semiconductor device according to (1), wherein the buffer layer is formed continuously or discontinuously.
(3) The semiconductor device according to (1) or (2), wherein the buffer layer includes one of an electrically-conductive organic material, an electrically-conductive inorganic material, and a mixed material thereof.
(4) The semiconductor device according to any one of (1) to (3), wherein the buffer layer includes one of an insulating material, a mixed material of the insulating material and an electrically-conductive organic material, and a mixed material of the insulating material and an electrically-conductive inorganic material.
(5) The semiconductor device according to (3) or (4), wherein the electrically-conductive organic material is one of polyethylene dioxythiophene (PEDOT), polypyrrole, and polyacetylene.
(6) The semiconductor device according to (3) or (4), wherein the electrically-conductive inorganic material is one of carbon nanotube, carbon black, molybdenum oxide (MoO), titanium oxide (TiO), and indium tin oxide (ITO).
(7) The semiconductor device according to (4), wherein the insulating material is silicon (Si).
(8) The semiconductor device according to any one of (1) to (7), wherein the organic semiconductor film is provided between the gate electrode and the pair of source-drain electrodes.
(9) The semiconductor device according to (8), wherein the gate electrode, the organic semiconductor film, and the pair of source-drain electrodes are provided in order on a substrate.
(10) The semiconductor device according to any one of (1) to (9), wherein the organic semiconductor film is provided between the pair of source-drain electrodes and a substrate.
(11) The semiconductor device according to (10), wherein the organic semiconductor film, the pair of source-drain electrodes, and the gate electrode are provided in order on the substrate.
(12) A semiconductor device including:
 a gate electrode;
 an organic semiconductor film forming a channel; and
 a pair of source-drain electrodes formed on the organic semiconductor film, the pair of source-drain electrodes each including a connection buffer layer and a wiring layer that are laminated in order, the connection buffer layer including an electric connection material and a buffer material.

(13) A method of manufacturing a semiconductor device, the method including:
forming a gate electrode;
forming an organic semiconductor film forming a channel; and
forming a connection layer, a buffer layer, and a wiring layer in order as a pair of source-drain electrodes on the organic semiconductor film.

(14) The method according to (13), wherein the wiring layer, the buffer layer, and the connection layer are etched in order to form the pair of source-drain electrodes.

(15) The method according to (13), wherein the wiring layer, the buffer layer, and the connection layer are etched collectively to form the pair of source-drain electrodes.

(16) The method according to any one of (13) to (15), wherein the organic semiconductor film is formed by any of cast coating, spin coating, spray coating, inkjet printing, relief printing, screen printing, gravure printing, and gravure offset printing.

(17) An electronic apparatus with a display section and a semiconductor device provided to drive the display section, the semiconductor device including:
a gate electrode;
an organic semiconductor film forming a channel; and
a pair of source-drain electrodes formed on the organic semiconductor film, the pair of source-drain electrodes each including a connection layer, a buffer layer, and a wiring layer that are laminated in order.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor device comprising:
a gate electrode;
an organic semiconductor film forming a channel; and
a pair of source-drain electrodes formed on the organic semiconductor film, the pair of source-drain electrodes each including a connection layer, a buffer layer, and a wiring layer that are laminated in order,
wherein the buffer layer is formed discontinuously, and
wherein the buffer layer includes polyethylene dioxythiophene (PEDOT).

2. The semiconductor device according to claim 1, wherein the buffer layer includes one of an electrically-conductive organic material, an electrically-conductive inorganic material, or a mixed material thereof.

3. The semiconductor device according to claim 2, wherein the electrically-conductive organic material is PEDOT.

4. The semiconductor device according to claim 2, wherein the electrically-conductive inorganic material is one of carbon nanotube, carbon black, molybdenum oxide (MoO), titanium oxide (TiO), or indium tin oxide (ITO).

5. The semiconductor device according to claim 1, wherein the buffer layer includes one of an insulating material, a mixed material of the insulating material and an electrically-conductive organic material, or a mixed material of the insulating material and an electrically-conductive inorganic material.

6. The semiconductor device according to claim 5, wherein the insulating material is silicon (Si).

7. The semiconductor device according to claim 1, wherein the organic semiconductor film is provided between the gate electrode and the pair of source-drain electrodes.

8. The semiconductor device according to claim 7, wherein the gate electrode, the organic semiconductor film, and the pair of source-drain electrodes are provided in order on a substrate.

9. The semiconductor device according to claim 1, wherein the organic semiconductor film is provided between the pair of source-drain electrodes and a substrate.

10. The semiconductor device according to claim 9, wherein the organic semiconductor film, the pair of source-drain electrodes, and the gate electrode are provided in order on the substrate.

11. A method of manufacturing a semiconductor device, the method comprising:
forming a gate electrode;
forming an organic semiconductor film forming a channel; and
forming a connection layer, a buffer layer, and a wiring layer in order as a pair of source-drain electrodes on the organic semiconductor film,
wherein the buffer layer is formed discontinuously, and
wherein the buffer layer includes polyethylene dioxythiophene (PEDOT).

12. The method according to claim 11, wherein the wiring layer, the buffer layer, and the connection layer are etched in order to form the pair of source-drain electrodes.

13. The method according to claim 11, wherein the wiring layer, the buffer layer, and the connection layer are etched collectively to form the pair of source-drain electrodes.

14. The method according to claim 11, wherein the organic semiconductor film is formed by any of cast coating, spin coating, spray coating, inkjet printing, relief printing, screen printing, gravure printing, or gravure offset printing.

15. An electronic apparatus with a display section and a semiconductor device provided to drive the display section, the semiconductor device comprising:
a gate electrode;
an organic semiconductor film forming a channel; and
a pair of source-drain electrodes formed on the organic semiconductor film, the pair of source-drain electrodes each including a connection layer, a buffer layer, and a wiring layer that are laminated in order,
wherein the buffer layer is formed discontinuously, and
wherein the buffer layer includes polyethylene dioxythiophene (PEDOT).

* * * * *